United States Patent
Yun et al.

(10) Patent No.: US 8,604,501 B2
(45) Date of Patent: *Dec. 10, 2013

(54) ORGANIC LIGHT EMITTING DISPLAY DEVICE

(75) Inventors: Jin-Young Yun, Yongin (KR); Seok-Gyu Yoon, Yongin (KR); Chang-Ho Lee, Yongin (KR); IL-Soo Oh, Yongin (KR); Hee-Joo Ko, Yongin (KR); Se-Jin Cho, Yongin (KR); Hyung-Jun Song, Yongin (KR); Sung-Chul Kim, Yongin (KR); Jong-Hyuk Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/204,321

(22) Filed: Aug. 5, 2011

(65) Prior Publication Data

US 2012/0097956 A1    Apr. 26, 2012

(30) Foreign Application Priority Data

Oct. 25, 2010   (KR) ................. 10-2010-00104181

(51) Int. Cl.
*H01L 33/40*   (2010.01)
*H01L 51/54*   (2006.01)

(52) U.S. Cl.
USPC ............... 257/98; 257/40; 257/59; 257/72; 257/88; 257/E33.002; 257/E33.003; 257/E33.004; 257/E33.063; 977/755; 977/773; 977/949

(58) Field of Classification Search
USPC .............. 257/40, 59, 72, 88, 98, E33.002, 257/E33.003, E33.004, E33.063; 977/755, 977/773, 949
See application file for complete search history.

(56) References Cited

U.S. PATENT DOCUMENTS

| | | | |
|---|---|---|---|
| 6,924,025 B2 | 8/2005 | Humbs | |
| 8,415,874 B2* | 4/2013 | Song et al. | 313/504 |
| 2004/0258957 A1 | 12/2004 | Yeh et al. | |
| 2007/0020484 A1* | 1/2007 | Kim et al. | 428/690 |
| 2008/0063949 A1* | 3/2008 | Inoue | 430/5 |
| 2009/0017331 A1 | 1/2009 | Iwakuma et al. | |
| 2009/0096357 A1 | 4/2009 | Lee et al. | |
| 2010/0079062 A1 | 4/2010 | Michels et al. | |
| 2010/0096622 A1 | 4/2010 | Iizumi et al. | |
| 2010/0123152 A1* | 5/2010 | Sugisawa et al. | 257/98 |
| 2011/0095261 A1* | 4/2011 | Kazlas et al. | 257/13 |

FOREIGN PATENT DOCUMENTS

| | | |
|---|---|---|
| JP | 0766947 | 10/2007 |
| KR | 2002-0079342 A | 10/2002 |
| KR | 10-0672535 B1 | 1/2007 |
| KR | 10-0766947 B1 | 10/2007 |
| KR | 10-0879477 B1 | 1/2009 |
| KR | 10-2009-0121317 A | 11/2009 |
| KR | 10-2010-0032888 A | 3/2010 |

\* cited by examiner

OTHER PUBLICATIONS

Registration Determination Certificate issued by the Korean Intellectual Property Office dated Nov. 30, 2011, 5 pages.

*Primary Examiner* — Dao H Nguyen
(74) *Attorney, Agent, or Firm* — Knobbe Martens Olson & Bear LLP

(57) ABSTRACT

An organic light emitting display device includes a substrate; a first electrode layer formed on the substrate; an emission structure layer formed on the first electrode layer; an electron injection layer (EIL) formed immediately on the emission structure layer and comprising a composite layer of LiF:Yb; and a second electrode layer formed on the EIL.

20 Claims, 4 Drawing Sheets

ORGANIC LIGHT EMITTING DISPLAY DEVICE

CROSS-REFERENCE TO RELATED APPLICATIONS

This application claims the benefit of Korean Patent Application No. 10-2010-0104181, filed on Oct. 25, 2010, in the Korean Intellectual Property Office, the disclosure of which is incorporated herein in its entirety by reference.

BACKGROUND

1. Field

The present embodiments relate to an organic light emitting display device, and more particularly, to an organic light emitting display device including an electron injection layer (EIL).

2. Description of the Related Technology

Organic light emitting display devices use a material that emits light when a voltage is applied. In comparison to liquid crystal display devices, organic light emitting display devices may have a higher luminance, wider viewing angles, and faster response speeds and may have a smaller thickness because a backlight is not required.

In an organic light emitting display device, an organic emission layer (EML) is interposed between an anode and a cathode. If a voltage is applied between the electrodes, holes from the anode and electrons from the cathode are injected into the organic EML. The injected holes and electrons cause electron switches between neighboring molecules in the organic EML and move to opposite electrodes. If the electrons and holes are recombined in some molecules, molecule excitons in an excited state of high energy are formed. The molecule excitons return to a ground state of low energy while emitting unique light of a material. This is an emission mechanism of the organic light emitting display device.

In order to improve the emission efficiency of an organic light emitting display device, efficient extraction of holes and electrons from an anode and a cathode and efficient transportation of holes and electrons to an EML are important. For this, a structure in which p-type and n-type organic semiconductor layers are stacked on an organic EML is generally used. Representative layers in the stacked structure include a hole injection layer (HIL) for receiving and transporting holes injected from an anode, a hole transport layer (HTL) for transporting the injected holes to an EML, an electron injection layer (EIL) for receiving and transporting electrons injected from a cathode, an electron transport layer (ETL) for transporting the injected electrons to an EML, and an EML for emitting light by recombining holes and electrons. The stacked structure of organic layers may increase the emission efficiency and may reduce a driving voltage.

Also, in an organic light emitting display device using microcavities, a stacked structure has a thickness that varies according to red (R), green (G), and blue (B) colors, and generally includes ten or more stacked layers. Due to the variance in thickness according to R, G, and B colors and the large number of stacked layers, a deposition structure and deposition equipment are complicated. Also, currently, a cathode of an organic light emitting display device is formed of only Mg:Ag. However, in a large display device, Mg:Ag causes a voltage drop due to its high resistance (~40 ohm/sq) and thus a problem in viewing angle occurs. Also, since the transmittance of Mg:Ag is reduced toward a long wavelength, a correction in viewing angle is required.

SUMMARY

The present embodiments provide an organic light emitting display device capable of ensuring excellent driving and lifetime characteristics, and simplifying a process.

According to an aspect of the present embodiments, there is provided an organic light emitting display device including a substrate; a first electrode layer formed on the substrate; an emission structure layer formed on the first electrode layer; an electron injection layer (EIL) formed immediately on the emission structure layer and comprising a composite layer of LiF:Yb; and a second electrode layer formed on the EIL.

A composition ratio of LiF:Yb may be from about 3:7 to 7:3.

A thickness of the EIL may be from about 50 Å to 100 Å. The emission structure layer may include a hole injection and transport layer (HITL), and an emission layer (EML) formed on the HITL. Alternatively, the emission structure layer may include a hole injection layer (HIL), a hole transport layer (HTL) formed on the HIL, and an EML formed on the HTL. The organic light emitting display device may further include an optical correction layer formed between the HITL and the EML. The organic light emitting display device may further include an optical correction layer formed between the HTL and the EML. The optical correction layer may be an HTL.

The EML may has an electron mobility equal to or greater than about $1.4 \times 10^{-6}$ cm$^2$/V·s.

The first electrode layer may be an anode and the second electrode layer may be a cathode. Alternatively, the first electrode layer may be a cathode and the second electrode layer may be an anode. In this case, the cathode is an Ag monolayer.

According to another aspect of the present embodiments, there is provided an organic light emitting display device including a substrate; a thin film transistor (TFT) including an active layer and a gate electrode formed on the substrate, a gate insulating layer formed between the active layer and the gate electrode, and source and drain electrodes contacting the active layer; a first electrode layer contacting one of the source and drain electrodes of the TFT; an emission structure layer formed on the first electrode layer; an electron injection layer (EIL) formed immediately on the emission structure layer and comprising a composite layer of LiF:Yb; and a second electrode layer formed on the EIL.

A composition ratio of LiF:Yb may be from about 3:7 to 7:3. A thickness of the EIL may be from about 50 Å to 100 Å.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION

Figure 1:
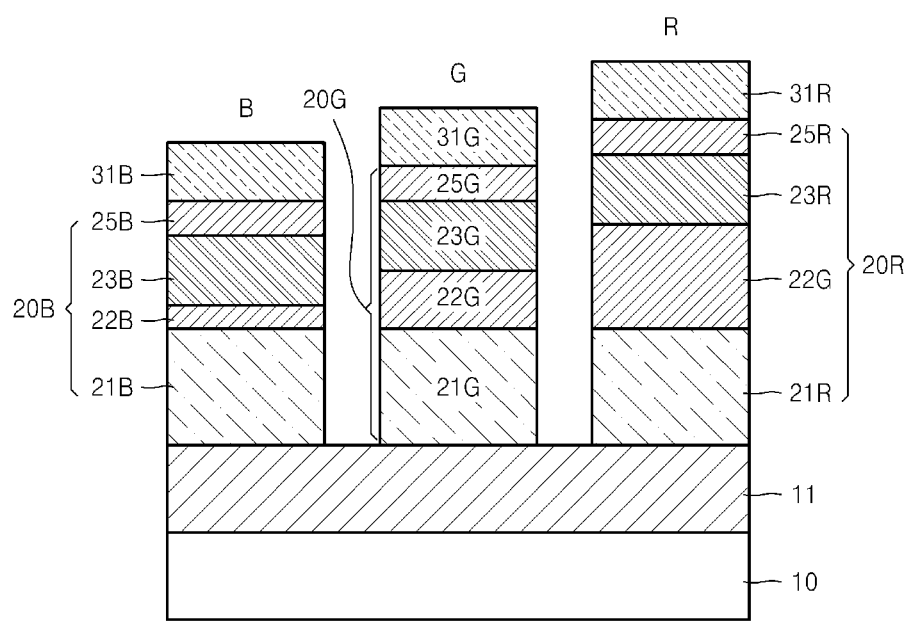
FIG. 1 is a cross-sectional view showing a stacked structure of an organic light emitting display device, according to an embodiment.

Hereinafter, the present embodiments will be described in detail by explaining example embodiments with reference to the attached drawings. The embodiments may, however, be embodied in many different forms and should not be construed as being limited to the embodiments set forth herein; rather, these embodiments are provided so that this disclosure will be thorough and complete, and will fully convey the concept of the embodiments to one of ordinary skill in the art. In the drawings, the thicknesses of layers and regions are exaggerated for clarity, and like reference numerals denote like elements.

FIG. 1 is a cross-sectional view showing a stacked structure of an organic light emitting display device, according to an embodiment. The organic light emitting display device illustrated in FIG. 1 has a microcavity structure, and includes red (R), green (G), and blue (B) regions for respectively emitting R, G, and B light. The R, G, and B regions include a substrate 10, a first electrode layer 11 formed on the substrate 10, emission structure layers 20R, 20G, and 20B formed on the first electrode layer 11, and second electrode layers 31R, 31G, and 31B formed respectively on the emission structure layers 20R, 20G, and 20B.

The emission structure layers 20R, 20G, and 20B respectively include sequentially stacked structures of hole injection and transport layers (HITLs) 21R, 21G, and 21B, optical correction layers 22R, 22G, and 22B, emission layers (EMLs) 23R, 23G, and 23B, and electron injection layers (EILs) 25R, 25G, and 25B.

In the organic light emitting display device illustrated in FIG. 1, the EMLs 23R, 23G, and 23B respectively generate R, G, and B light, and the optical correction layers 22R, 22G, and 22B respectively satisfy resonance conditions in the R, G, and B regions according to R, G, and B colors.

The substrate 10 may be a substrate used in a typical organic light emitting display device, e.g., a glass substrate or a transparent plastic substrate which are excellent in mechanical strength, thermal stability, transparency, surface smoothness, tractability, and water resistance. In the substrate 10, a driving device, a switching device, such as a thin film transistor (TFT), etc. may be formed.

The first electrode layer 11 is formed on the substrate 10. The first electrode layer 11 may be an anode. The first electrode layer 11 may comprise transparent conductive oxide such as indium tin oxide (ITO), indium zinc oxide (IZO), zinc oxide (ZnO), or $In_2O_3$.

Each of the HITLs 21R, 21G, and 21B on the first electrode layer 11 may be formed as one layer having hole injection and transport abilities, or two layers, e.g., a hole injection layer (HIL) and a hole transport layer (HTL).

If each of the HITLs 21R, 21G, and 21B is formed as one layer, a material, such as a carbazole derivative, N,N'-bis(3-methylphenyl)-N,N'-diphenyl-[1,1-biphenyl]-4,4'-diamine (TPD), or N,N'-di(naphthalene-1-yl)-N,N'-diphenyl benzidine (α-NPD), may be used.

If each of the HITLs 21R, 21G, and 21B comprises an HIL and an HTL, a well-known hole injection material and a hole transport material may be used.

The hole injection material may include, for example, a phthalocyanine compound, such as copper phthalocyanine, 4,4',4"-tris(3-methylphenylphenylamino) triphenylamine (m-MTDATA), N,N'-di(-naphthyl)-N,N'-diphenylbenzidine (NPB), 4,4'4"-tris(N,N-diphenylamino)triphenylamine (TDATA), 4,4',4"-tris(N,-(2-naphthyl)-N-phenylamino) triphenylamine (2T-NATA), polyaniline/dodecylbenzene-sulfonic acid (Pani/DBSA), Poly(3,4-ethylenedioxythiophene)/Poly(4-styrene sulfonate) (PEDOT/PSS), polyaniline/camphor sulfonic acid (Pani/CSA), or polyaniline)/poly(4-styrenesulfonate (PANI/PSS), but is not limited thereto. The thickness of the HIL may be about 100 Å to about 10000 Å, and more particularly, about 100 Å to about 1000 Å. If the thickness of the HIL satisfies the above range, satisfactory hole injection characteristics may be obtained without a reduction in driving voltage.

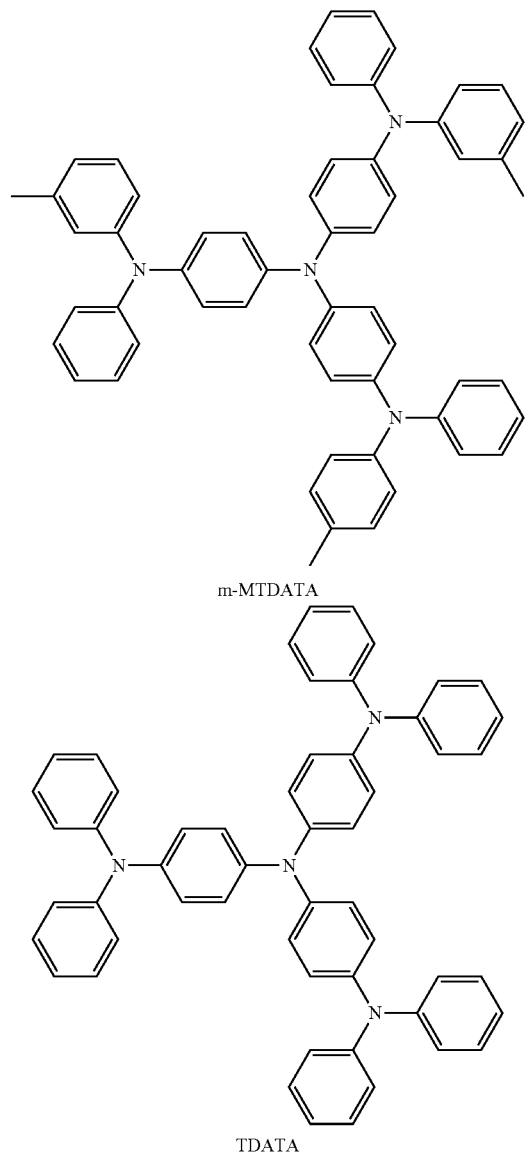

m-MTDATA

TDATA

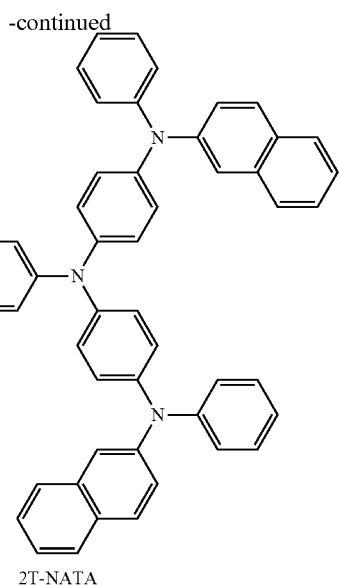

2T-NATA

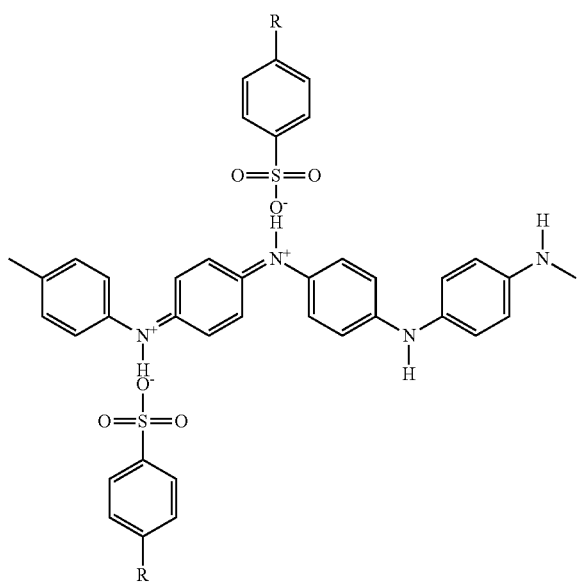

Pani/DBSA

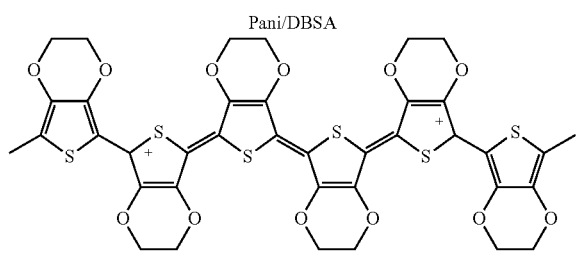

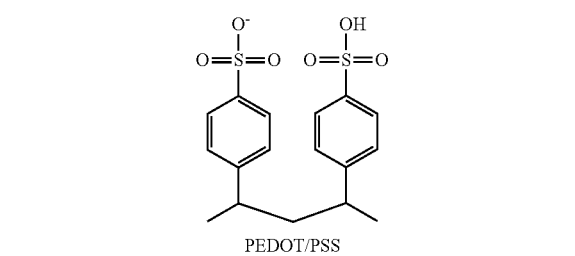

PEDOT/PSS

The hole transport material may include a well-known hole transport material, for example, a carbazole derivative, such as N-phenylcarbazole or polyvinyl carbazole, an amine derivative having a fused aromatic ring, such as, N,N'-bis(3-methylphenyl)-N,N'-diphenyl-[1,1-biphenyl]-4,4'-diamine (TPD) or N,N'-di(naphthalene-1-yl)-N,N'-diphenyl benzidine (α-NPD), or a triphenylamine-based material such as 4,4',4''-tris(N-carbazolyl)triphenylamine (TCTA). From among them, for example, TCTA may prevent diffusion of exitons from an EML in addition to a hole transport function.

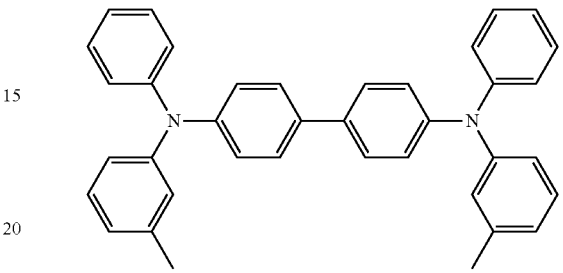

TPD

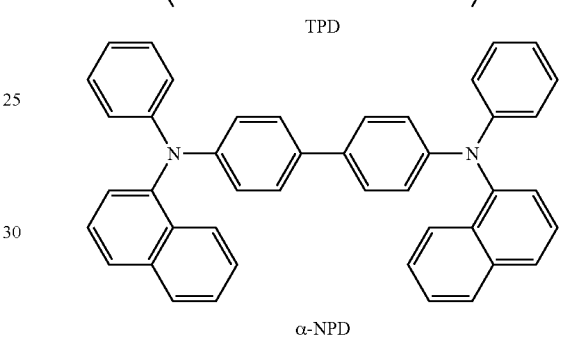

α-NPD

The thickness of the HTL may be about 50 Å to about 1000 Å, and more particularly, about 100 Å to about 800 Å. If the thickness of the HTL satisfies the above range, satisfactory hole transport characteristics may be obtained without a reduction in driving voltage.

The optical correction layers 22R, 22G, and 22B may comprise the same material as that of the HTL. The optical correction layers 22R, 22G, and 22B correct with respect to R, G, and B colors the thickness of a medium of a microcavity comprising the organic light emitting display device.

In the organic light emitting display device, color purity may be adjusted by selecting an emission material. However, even when the color purity of the emission material is excellent, in some cases, an emission efficiency or a lifetime of the organic light emitting display device may not be satisfactory. In order to compensate for the color purity, the emission efficiency, and the lifetime, a microcavity effect, e.g., a light interference effect, may be used. In this case, facing pixel electrodes form mirrors of a cavity. A metal electrode (cathode) may function as a mirror, and an interface between a transparent electrode (anode) and glass having a large difference in refractive index therebetween may function as a translucent mirror. An EML structure between the metal electrode and the transparent electrode may function as a medium of a cavity, and the form and intensity of an emission spectrum may vary by changing the thickness of the EML structure and thus changing a resonance condition.

The thickness of the EML structure is differently set according to colors so as to satisfy the resonance condition, and the thickness of the optical correction layers 22R, 22G, and 22B may also be differently set according to the thickness of the EML structure. The thickness of the optical correction layer 22R in the R region having a long wavelength is largest, and the thickness of the optical correction layer 22B in the B region having a short wavelength is the smallest. If the resonance thickness in the blue region B is satisfied by the other layers of the EML structure, the optical correction layer 22B may not be used.

Each of the EMLs 23R, 23G, and 23B may include one emission material or a combination of a host and a dopant. A well-known host may include, for example, Alq₃, 4,4'-N,N'-dicarbazole-biphenyl (CBP), poly(n-vinyl carbazole) (PVK), 9,10-di(naphthalene-2-yl) anthracene (ADN), TCTA, 3,5-tris(N-phenylbenzimidazole-2-yl)benzene (TPBI), 3-tert-butyl-9,10-di(naphth-2-yl) anthracene (TBADN), 9,9-diethyl-2-(9,9-diethyl-2-(9,9-diethyl-9H-fluoren-2-yl)-9H-fluoren-7-yl)-9H-fluorene (E3), or distyrylarylene (DSA), but is not limited thereto.

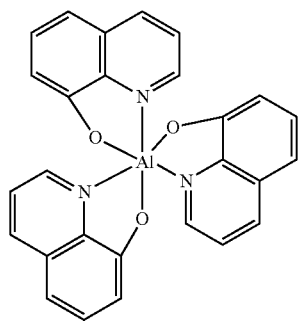

Alq₃

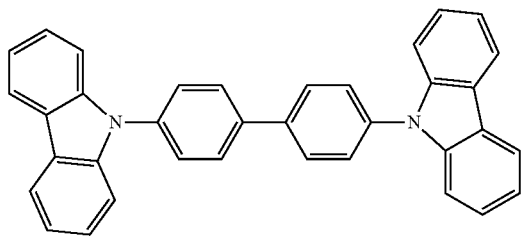

CBP

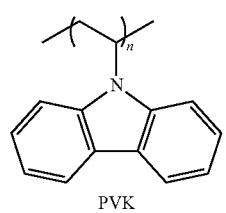

PVK

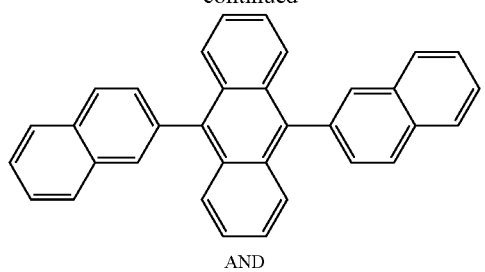

AND

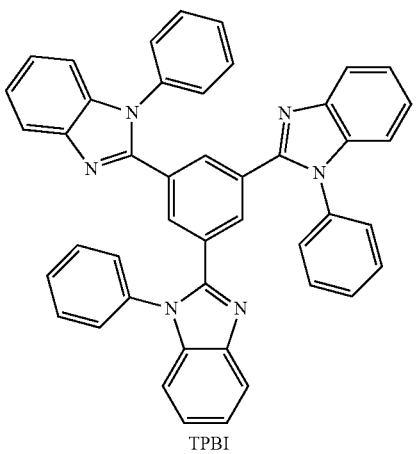

TPBI

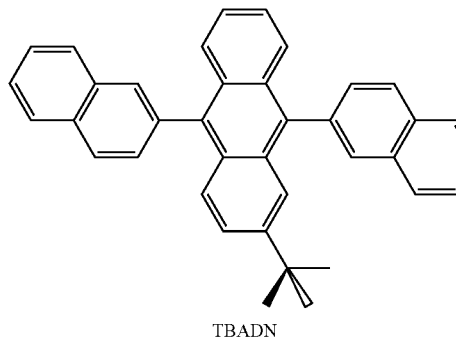

TBADN

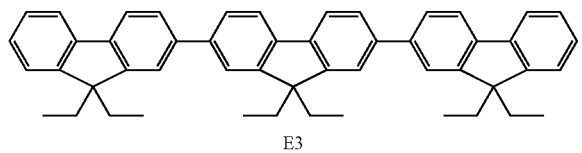

E3

Also, a well-known red dopant used in the EML 23R may include, for example, PtOEP, Ir(piq)₃, or Btp₂Ir(acac), but is not limited thereto.

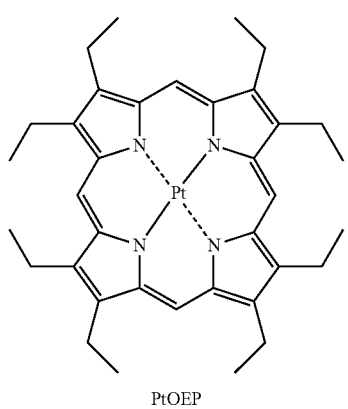

PtOEP

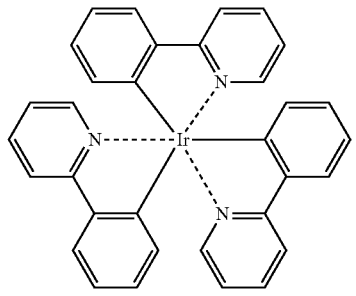

Ir(ppy)₃

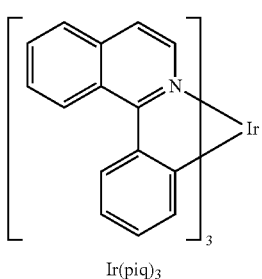

Ir(piq)₃

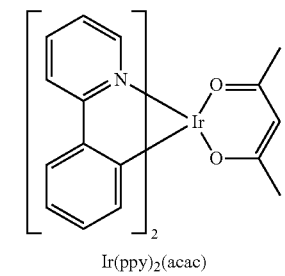

Ir(ppy)₂(acac)

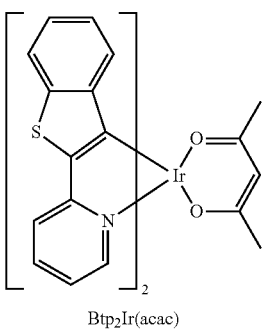

Btp₂Ir(acac)

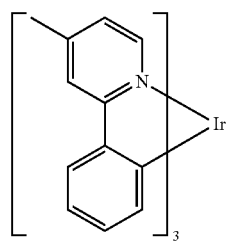

Ir(mpyp)₃

Also, a well-known green dopant used in the EML 23G may include, for example, Ir(ppy)₃, Ir(ppy)₂(acac), or Ir(m-pyp)₃, but is not limited thereto.

Also, a well-known blue dopant used in the EML 23B may include, for example, F₂Irpic, (F₂ppy)₂Ir(tmd), Ir(dfppz)₃, ter-fluorene, 4,4'-bis(4-diphenylaminosteril) biphenyl (DPAVBi), or 2,5,8,11-tetra-t-butyl perylene (TBPe), but is not limited thereto.

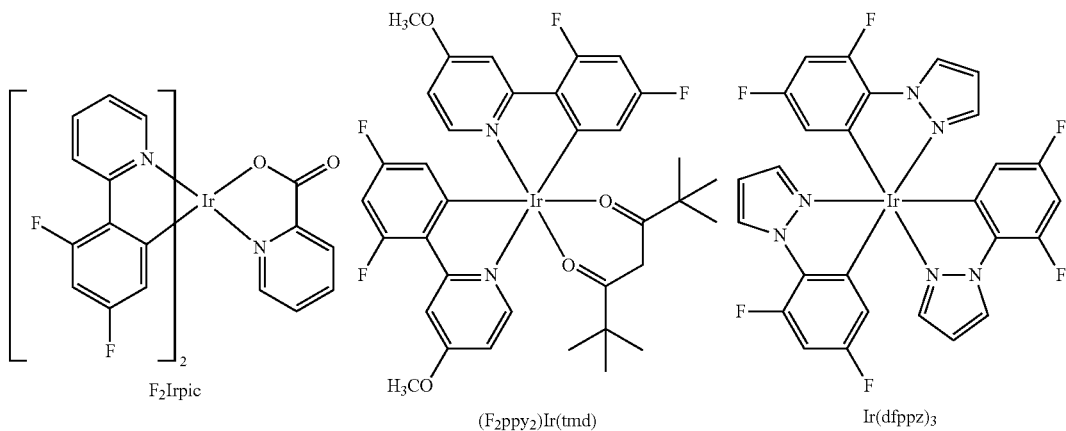

F₂Irpic    (F₂ppy)₂Ir(tmd)    Ir(dfppz)₃

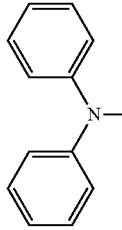
DPAVBi

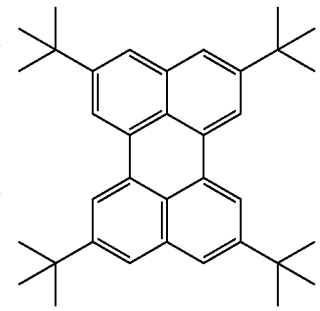
TBPe

If each of the EMLs 23R, 23G, and 23B includes a host and a dopant, typically, the content of the dopant may be about 0.01 to about 15 weight parts with respect to about 100 weight parts of the host, but is not limited thereto. The thickness of the EMLs 23R, 23G, and 23B may be about 100 Å to about 1000 Å.

Each of the EILs 25R, 25G, and 25B may comprise a composite layer of LiF:Yb. Since LiF has advantageous electron injection characteristics, and Yb enhances the electron injection characteristics, the composite layer of LiF:Yb is appropriate to inject electrons from a cathode and to transport the electrons to an EML. Also, since the composite layer of LiF:Yb has excellent characteristics for contacting silver (Ag), an Ag monolayer may be used as the cathode.

LiF:Yb has superior electron injection characteristics to those of a typical EIL and thus electrons may be appropriately injected to a lowest unoccupied molecular orbital (LUMO) level of an EML without using an electron transport layer (ETL). In this case, a ratio of LiF:Yb may be about 7:3 to about 3:7. Injection from Ag is disadvantageous if the ratio of LiF:Yb is greater than about 7:3 and optical absorption is increased and thus a problem occurs in efficiency if the ratio of LiF:Yb is less than 3:7.

The thickness of the EILs 25R, 25G, and 25B may be about 50 Å to about 100 Å. A lifetime of the organic light emitting display device is reduced if thickness of the EILs 25R, 25G, and 25B is less than 50 Å and electrons are not appropriately injected and thus a driving voltage is increased if the thickness of the EILs 25R, 25G, and 25B is greater than about 100 Å.

Since the EILs 25R, 25G, and 25B have a thickness of about 50 Å to about 100 Å, when the second electrode layers 31R, 31G, and 31B are formed by performing a sputtering process, the EILs 25R, 25G, and 25B may perform a buffering function and thus organic material layers under the EILs 25R, 25G, and 25B may be prevented from being damaged.

Each of the second electrode layers 31R, 31G, and 31B may be an MgAg layer, or may be an Ag monolayer having excellent characteristics for contacting the composite layer of LiF:Yb as described above. The Ag monolayer has a lower resistance than that of the MgAg layer and thus may solve a problem of asymmetric pixels caused by a voltage drop. Also, the Ag monolayer has superior reflection characteristics to those of the MgAg layer and thus may provide an advantage in efficiency of a top-emission device using microcavities.

Although the first electrode layer 11 is commonly formed in the R, G, and B regions and the second electrode layers 31B, 31G, and 31R are separately formed in the R, G, and B regions in FIG. 1, according to another embodiment, three first electrode layers may be separately formed in the R, G, and B regions and one second electrode layer may be commonly formed in the R, G, and B regions.

Furthermore, although the first electrode layer 11 on the substrate 10 is an anode and the second electrode layers 31B, 31G, and 31R are cathodes in FIG. 1, according to another embodiment, the first electrode layer 11 on the substrate 10 may be a cathode and the second electrode layers 31B, 31G, and 31R may be anodes. In this case, the order of stacking the emission structure layers 20B, 20G, and 20R may be changed.

Figure 2:
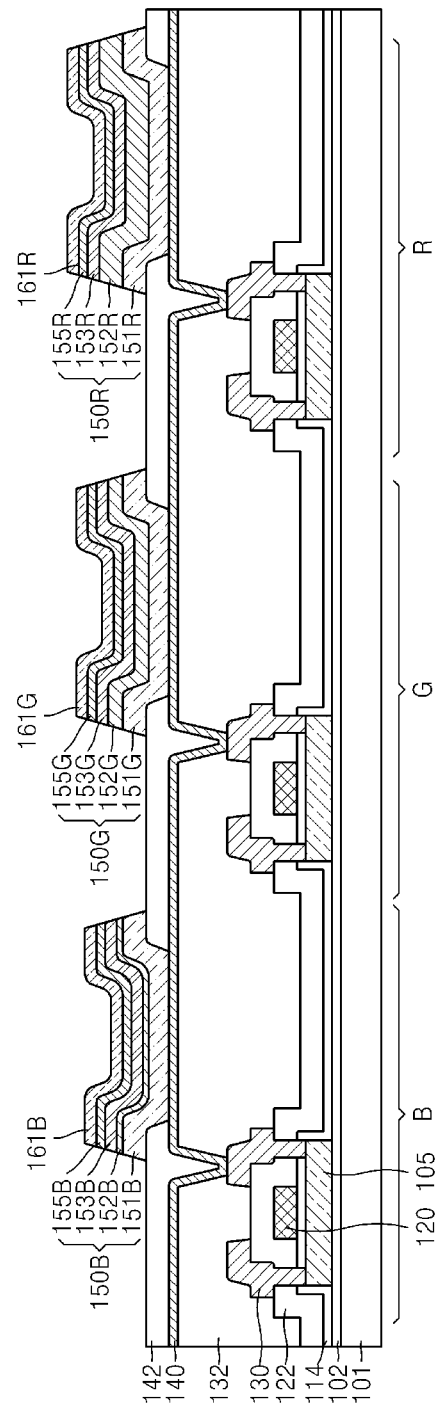
FIG. 2 is a cross-sectional view of an organic light emitting display device having a stacked structure, according to an embodiment.

FIG. 2 is a cross-sectional view of an organic light emitting display device having a stacked structure, according to an embodiment. The organic light emitting display device illustrated in FIG. 2 has R, G, and B sub pixels.

Referring to FIG. 2, a buffer layer 102 is formed on a substrate 101. The substrate 101 may comprise, for example, a material, such as glass, quartz, or plastic, or another material, such as silicon, ceramic, or metal. The buffer layer 102 is used to prevent impurities, such as alkali ions generated by the substrate 101, from penetrating into a TFT or to insulate the substrate 101 if the substrate 101 includes mobile ions or is conductive. The buffer layer 102 may comprise, for example, silicon oxide (SiO$_2$), silicon nitride (SiNx), or silicon oxynitride (SiONx).

An active layer 105 is formed on the buffer layer 102. The active layer 105 may comprise polycrystalline silicon, amorphous silicon, an oxide semiconductor, or an organic semiconductor, for example. The active layer 105 may include p-type-doped or n-type-doped source and drain regions, and a channel region formed between the source and drain regions.

A gate insulating layer 114 is formed on the active layer 105, and a gate electrode 120 is formed on the gate insulating layer 114. The gate insulating layer 114 may be, for example, an insulating layer, such as a SiO$_2$ layer or a SiNx layer, and may be a monolayer or a plurality of layers. The gate electrode 120 may comprise, for example, gold (Au), silver (Ag), copper (Cu), nickel (Ni), platinum (Pt), palladium (Pd), aluminum (Al), molybdenum (Mo), tungsten (W), titanium (Ti), or an alloy thereof, and may be a monolayer or a plurality of layers.

A first interlayer insulating layer 122 is formed on the gate electrode 120 and the gate insulating layer 114. The first interlayer insulating layer 122 may be an insulating layer, such as a $SiO_2$ layer or a SiNx layer, and may be a monolayer or a plurality of layers.

Source and drain electrodes 130 contact the active layer 105 through the first interlayer insulating layer 122. The source and drain electrodes 130 may comprise, for example, one of various materials including Au, Ag, Cu, Ni, Pt, Pd, Al, Mo, W, Ti, and alloys thereof.

A second interlayer insulating layer 132 is formed on the source and drain electrodes 130, and may be an organic or inorganic layer. A first electrode 140 in a pixel unit extends on the second interlayer insulating layer 132 and contacts one of the source and drain electrodes 130 through the second interlayer insulating layer 132. The first electrode 140 may be an anode and may comprise, for example, transparent conductive oxide, such as ITO or IZO.

A pixel defining layer 142 is formed on the second interlayer insulating layer 132 to expose the first electrode 140. The pixel defining layer 142 may be an organic or inorganic layer. Emission structure layers 150R, 150G, and 150B and second electrode layers 161R, 161G, and 161B are formed as described above in relation to FIG. 1 to contact the first electrode 140 exposed through the pixel defining layer 142.

As described above in relation to FIG. 1, the emission structure layers 150R, 150G, and 150B respectively include HITLs 151R, 151G, and 151B, optical correction layers 152R, 152G, and 152B, EMLs 153R, 153G, and 153B, and EILs 155R, 155G, and 155B. In this case, the optical correction layers 152R, 152G, and 152B in R, G, B regions have different thicknesses in order to satisfy a resonance condition. Each of the EILs 155R, 155G, and 155B comprises a composite layer of Li:Yb.

Also, the organic light emitting display device is not limited to the structure illustrated in FIG. 2. For example, although a top-gate-type TFT is illustrated in FIG. 2, according to another embodiment, a back-gate-type TFT may also be used.

Also, although a structure in which a first electrode is an anode, a second electrode is a cathode, and the anode contacts source and drain electrodes is illustrated in FIG. 2, according to another embodiment, a structure in which a first electrode is a cathode, a second electrode is an anode, and the cathode contacts source and drain electrodes may also be used.

The organic light emitting display device may be of a bottom emission type or a top emission type, and connection between a TFT and an organic light emitting display device may differ according to the type of the organic light emitting display device.

Comparative Examples and Embodiments

An organic light emitting display device according to comparative example 1 has a stacked emission structure of HIL/HTL/EML/ETL/EIL and a cathode of MgAg. In this case, the EIL comprises LiF 10 Å.

An organic light emitting display device according to comparative example 2 has the same structure as that of comparative example 1 except that the EIL comprises LiF 20 Å.

An organic light emitting display device according to comparative example 3 has the same structure as that of comparative example 1 except that the EIL comprises LiF:Yb 150 Å and the ETL is not used. In this case, a ratio of LiF:Yb is 1:1.

An organic light emitting display device according to embodiment 1 has the same structure as that of comparative example 1 except that the EIL comprises LiF:Yb 50 Å and the ETL is not used.

An organic light emitting display device according to embodiment 2 has the same structure as that of embodiment 1 except that the EML comprises a material having a higher electron mobility than that of $Alq_3$ ($>1.4\times10^{-6}$ $cm^2/V\cdot s$).

Driving Characteristics

Table 1 shows driving characteristics of the organic light emitting display device using a composite layer of LiF:Yb to form the EIL according to embodiment 1, and the organic light emitting display devices using a single material of LiF to form the EIL according to comparative examples 1 and 2.

TABLE 1

| | | Voltage (V) | Current Density (mA/cm$^2$) | Current Efficiency (Cd/A) | Power Efficiency (lm/W) | Brightness (Cd/m$^2$) | Color Coordinate | |
|---|---|---|---|---|---|---|---|---|
| | | | | | | | CIEx | CIEy |
| Comparative Example 1 | LiF (10 Å) | 3.5 | 7.29 | 4.58 | 4.11 | 333.7 | 0.1242 | 0.094 |
| | | 5 | 46.19 | 3.88 | 2.44 | 1794 | 0.1247 | 0.093 |
| Comparative Example 2 | LiF (20 Å) | 5 | 12.63 | 3.43 | 2.15 | 432.7 | 0.1422 | 0.049 |
| | | 6.5 | 64.12 | 1.98 | 0.96 | 1270 | 0.1425 | 0.05 |
| Embodiment 1 | LiF/Yb (50 Å) | 3.5 | 6.35 | 1.92 | 1.72 | 121.70 | 0.15 | 0.04 |
| | | 4.5 | 56.41 | 1.62 | 1.13 | 915.70 | 0.15 | 0.04 |

Referring to Table 1, the current density when 5V is applied in comparative example 1 using LiF 10 Å is 46.19 mA/cm$^2$ while the current density when 5V is applied in comparative example 2 using LiF 20 Å is 12.63 mA/cm$^2$. If the thickness of LiF is increased from about 10 Å to 20 Å, the current density is greatly reduced. However, in embodiment 1 using LiF/Yb 50 Å, the current density when 4.5V is applied is 56.41 mA/cm$^2$. Even if the thickness of LiF/Yb is five times greater than that of LiF 10 Å, a greater current density may be obtained by applying a smaller voltage. As such, if the EIL comprises LiF/Yb, in comparison to a case when the EIL comprises LiF, a higher current density may be maintained with the increased thickness of the EIL by applying a low driving voltage.

Lifetime

Figure 3:
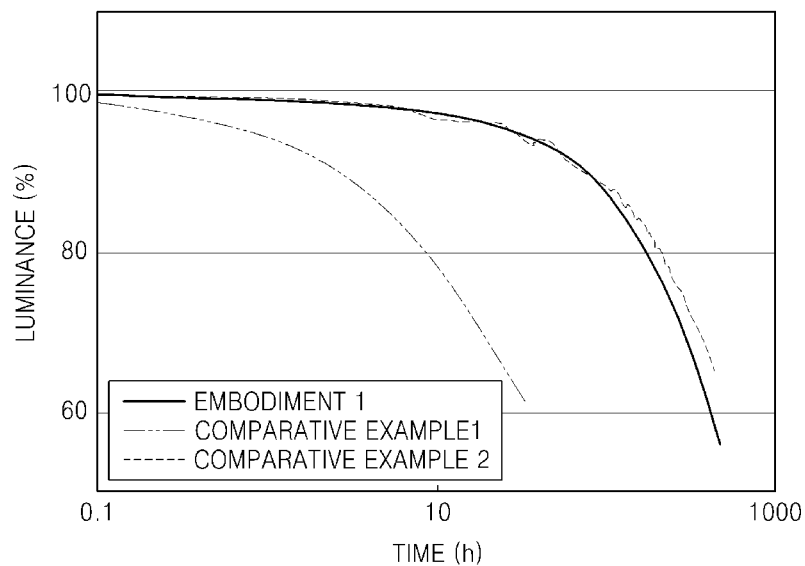
FIG. 3 is a graph showing lifetimes of organic light emitting display devices according to comparative examples 1 and 2, and embodiment 1.

FIG. 3 is a graph showing lifetimes of the organic light emitting display devices according to comparative examples 1 and 2, and embodiment 1. In FIG. 3, an initial luminance is set as 100% and reductions in luminance at a current density of 15 mA/cm$^2$ are compared in the organic light emitting display devices according to comparative examples 1 and 2, and embodiment 1. Referring to FIG. 3, a reduction in luminance occurs first in comparative example 1 using LiF 10 Å, and comparative example 2 using LiF 20 Å and embodiment 1 using LiF:Yb 50 Å have similar reductions in luminance. As such, if the EIL comprises LiF:Yb, lifetime characteristics are excellent.

Driving Characteristics according to Thickness of LiF:Yb

Figure 4:
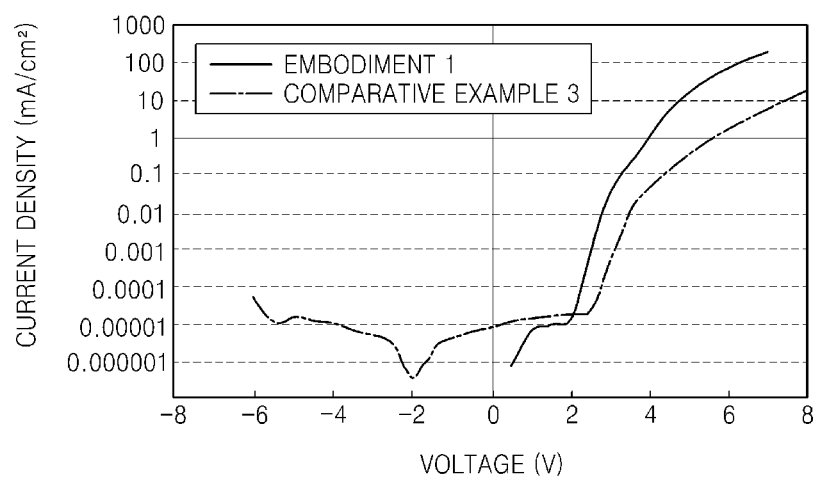
FIG. 4 is a graph showing a driving voltage versus a current density in organic light emitting display devices according to comparative example 3 and embodiment 1.

FIG. 4 is a graph showing a driving voltage versus a current density in the organic light emitting display devices according to comparative example 3 and embodiment 1. Referring to FIG. 4, at the same current density, a driving voltage required when LiF:Yb has a thickness of 150 Å is greater than that required when LiF:Yb has a thickness of 50 Å. As such, if the thickness of LiF:Yb exceeds a predetermined range, current density characteristics deteriorate.

Lifetime Characteristics

Figure 5:
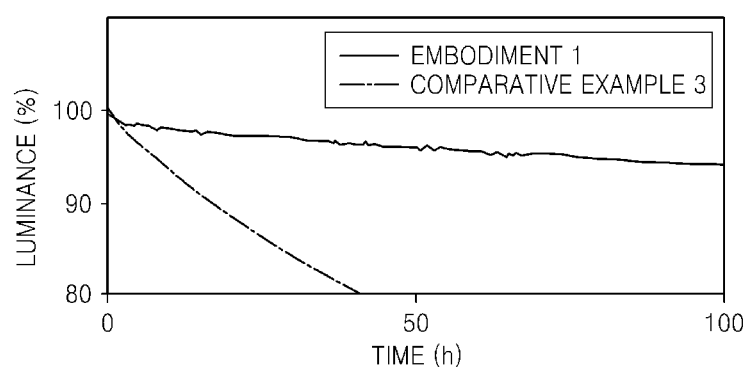
FIG. 5 is a graph showing lifetimes of organic light emitting display devices according to comparative example 3 and embodiment 1.

FIG. 5 is a graph showing lifetimes of the organic light emitting display devices according to comparative example 3 and embodiment 1. In FIG. 5, an initial luminance is set as 100% and reductions in luminance at a current density of 15 mA/cm$^2$ are compared between the organic light emitting display devices according to comparative example 3 and embodiment 1. Referring to FIG. 5, the luminance when LiF:Yb has a thickness of 50 Å according to embodiment 1 is reduced smoothly while the luminance when LiF:Yb has a thickness of 150 Å according to comparative example 3 is reduced rapidly. As such, if the thickness of LiF:Yb exceeds a predetermined range, lifetime characteristics also deteriorate.

Relation with EML

Figure 6:
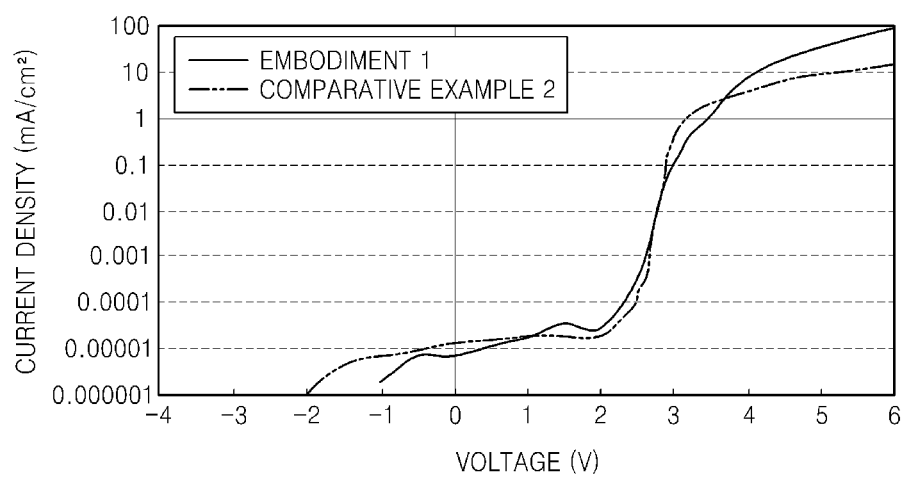
FIG. 6 is a graph showing a driving voltage versus a current density in organic light emitting display devices according to embodiments 1 and 2.

FIG. 6 is a graph showing a driving voltage versus a current density in organic light emitting display devices according to embodiments 1 and 2. The EML comprises $Alq_3$ in embodiment 1, and comprises a material having a higher electron mobility than that of $Alq_3$ in embodiment 2. In FIG. 6, at the same current density, a driving voltage required by the organic light emitting display device according to embodiment 2 is less than a driving voltage required by the organic light emitting display device according to embodiment 1. As such, if the EML comprises a material having a high electron mobility, driving characteristics are improved.

If an EIL comprises a composite layer of LiF:Yb, an ETL may be omitted and thus the structure and a manufacturing process of an organic light emitting display device may be simplified. Also, since LiF:Yb may have a large thickness, an emission structure layer comprising an organic material may be prevented from being damaged when a second electrode is formed. Furthermore, since contact characteristics between LiF:Yb and Ag are excellent, if the second electrode comprises Ag, the resistance of the second electrode may be reduced.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. An organic light emitting display device comprising:
   a substrate;
   a first electrode layer formed on the substrate;
   an emission structure layer formed on the first electrode layer;
   an electron injection layer (EIL) formed on and contacting the emission structure layer and comprising a composite layer of LiF:Yb; and
   a second electrode layer formed on the EIL.

2. The organic light emitting display device of claim 1, wherein the composition ratio of LiF:Yb is from about 3:7 to about 7:3.

3. The organic light emitting display device of claim 1, wherein a thickness of the EIL is from about 50 Å to about 100 Å.

4. The organic light emitting display device of claim 1, wherein the emission structure layer comprises a hole injection and transport layer (HITL), and an emission layer (EML) formed on the HITL.

5. The organic light emitting display device of claim 1, wherein the emission structure layer comprises a hole injection layer (HIL), a hole transport layer (HTL) formed on the HIL, and an EML formed on the HTL.

6. The organic light emitting display device of claim 4, further comprising an optical correction layer formed between the HITL and the EML.

7. The organic light emitting display device of claim 5, further comprising an optical correction layer formed between the HTL and the EML.

8. The organic light emitting display device of claim 6, wherein the optical correction layer is an HTL.

9. The organic light emitting display device of claim 4, wherein the EML has an electron mobility equal to or greater than about $1.4 \times 10^{-6}$ cm$^2$/V·s.

10. The organic light emitting display device of claim 1, wherein the first electrode layer is an anode and the second electrode layer is a cathode.

11. The organic light emitting display device of claim 1, wherein the first electrode layer is a cathode and the second electrode layer is an anode.

12. The organic light emitting display device of claim 10 or 11, wherein the anode comprises a transparent conductive oxide.

13. The organic light emitting display device of claim 12, wherein the anode comprises indium tin oxide (ITO), indium zinc oxide (IZO), zinc oxide (ZnO), or $In_2O_3$.

14. The organic light emitting display device of claim 10, wherein the cathode comprises an alloy containing silver (Ag).

15. The organic light emitting display device of claim 10, wherein the cathode is an Ag monolayer.

16. The organic light emitting display device of claim 1, wherein the first electrode layer is a common electrode layer of pixels.

17. The organic light emitting display device of claim 1, wherein the second electrode layer is a common electrode layer of pixels.

18. An organic light emitting display device comprising:
   a substrate;
   a thin film transistor (TFT) comprising an active layer and a gate electrode formed on the substrate, a gate insulating layer formed between the active layer and the gate electrode, and source and drain electrodes contacting the active layer;
   a first electrode layer contacting one of the source and drain electrodes of the TFT;
   an emission structure layer formed on the first electrode layer;
   an electron injection layer (EIL) formed on and contacting the emission structure layer and comprising a composite layer of LiF:Yb; and
   a second electrode layer formed on the EIL.

19. The organic light emitting display device of claim 18, wherein the composition ratio of LiF:Yb is from about 3:7 to about 7:3.

20. The organic light emitting display device of claim 18, wherein a thickness of the EIL is from about 50 Å to about 100 Å.

* * * * *